(12) United States Patent  (10) Patent No.: US 7,400,202 B2
Yamamoto et al.  (45) Date of Patent: Jul. 15, 2008

(54) BIAS CIRCUIT FOR POWER AMPLIFIER OPERATED BY A LOW EXTERNAL REFERENCE VOLTAGE

(75) Inventors: Kazuya Yamamoto, Tokyo (JP); Kousei Maemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 62 days.

(21) Appl. No.: 11/552,635

(22) Filed: Oct. 25, 2006

(65) Prior Publication Data

US 2007/0115062 A1  May 24, 2007

(30) Foreign Application Priority Data

Nov. 8, 2005  (JP)  ............... 2005-323349

(51) Int. Cl.
*H03F 3/04* (2006.01)
(52) U.S. Cl. ...................... 330/296; 330/289
(58) Field of Classification Search ............... 330/285, 330/289, 296
See application file for complete search history.

(56) References Cited

U.S. PATENT DOCUMENTS

| 6,946,913 | B2 * | 9/2005 | Moriwaki et al. | ............ 330/296 |
| 7,009,453 | B2 * | 3/2006 | Kuriyama | ................... 330/289 |

| 2004/0251967 | A1 | 12/2004 | Moriwaki et al. |

FOREIGN PATENT DOCUMENTS

| EP | 1 515 434 | 3/2005 |
| JP | 2001-313531 | 11/2001 |
| JP | 2003-229728 | 8/2003 |
| JP | 2004-343244 | 12/2004 |

\* cited by examiner

*Primary Examiner*—Khanh V Nguyen
(74) *Attorney, Agent, or Firm*—Leydig, Voit & Mayer, Ltd.

(57) ABSTRACT

A bias circuit includes a resistor in parallel with a voltage-drive bias circuit including a GaAs-HBT transistor. This configuration ensures that a current can be supplied from a reference voltage input terminal to the base terminal of a first transistor via the resistor in an idling state in which a voltage applied to the base terminal is lower than a voltage at which a second transistor operates, thereby enabling a desired amplifying operation while maintaining the idling current generally constant in a temperature range, even when the reference voltage is reduced to a value lower than twice the barrier voltage of the GaAs HBT.

13 Claims, 12 Drawing Sheets

BIAS CIRCUIT FOR POWER AMPLIFIER OPERATED BY A LOW EXTERNAL REFERENCE VOLTAGE

BACKGROUND OF THE INVENTION

1. Field of the Invention

The present invention relates to a bias circuit for a power amplifier and, more particularly, to a bias circuit including an emitter follower integrally formed on one GaAs chip for a power amplifier and capable of operating by a low external reference voltage.

2. Background Art

GaAs-heterojunction bipolar transistors (GaAs-HBTs) have recently come into wide use in power amplifiers for portable telephones including those in code division multiple access (CDMA) systems and power amplifiers for wireless LANs.

In Japanese Unexamined Patent Publication No. 2004-343244, a circuit formed as a conventional GaAs-HBT power amplifier module is disclosed.

Figure 7A:
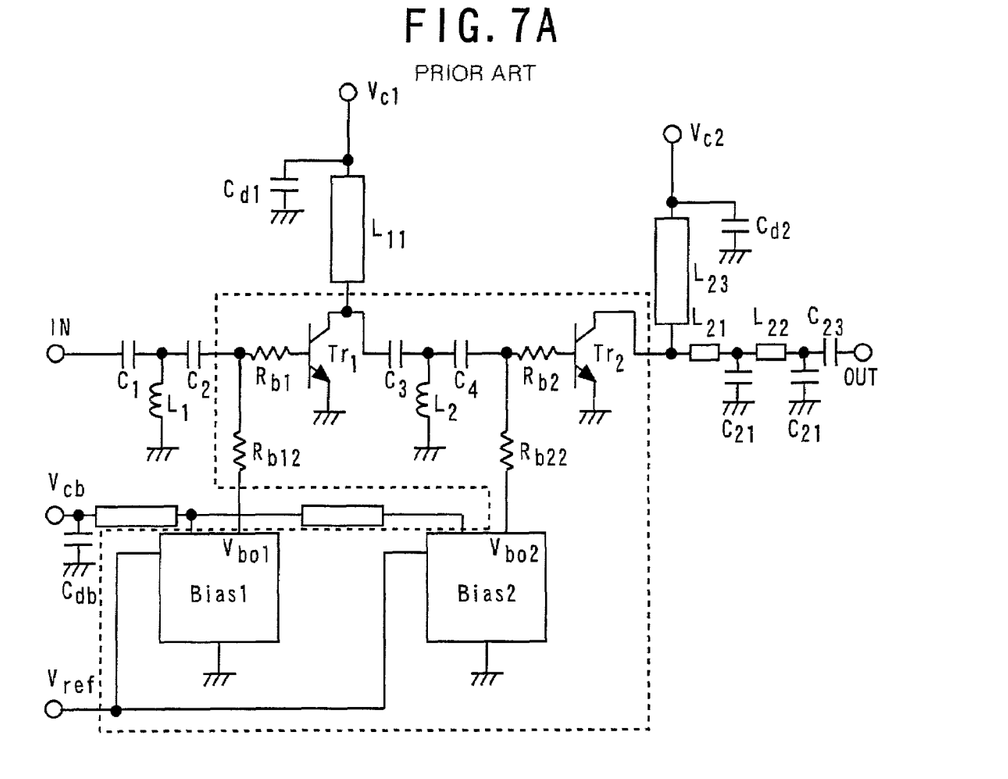
FIGS. 7A and 7B show an example of a conventional GaAs-HBT power amplifier module.
Figure 7B:
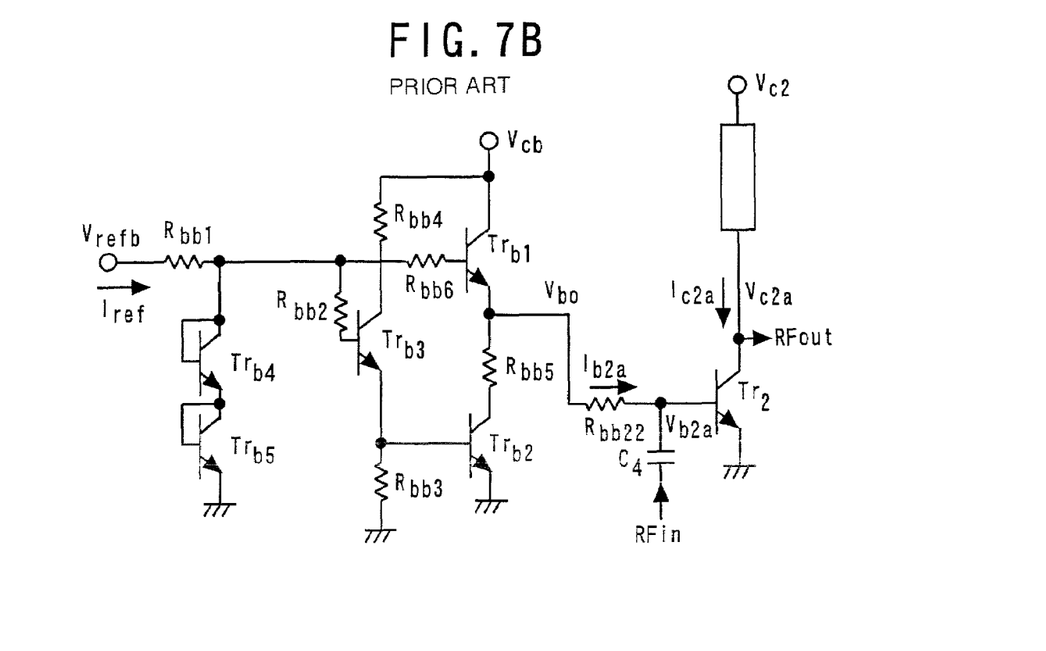

FIGS. 7A and 7B show an example of a conventional GaAs-HBT power amplifier module. A portion of the module shown within the area surrounded by the broken line in FIG. 7A is formed on a GaAs chip. Portions other than the portion within the broken-line area are formed by chip parts and lines on the module circuit board.

The circuit shown in FIG. 7A has an RF signal input terminal (IN) and an RF signal output terminal (OUT). Tr1 and Tr2 denote an initial-stage heterojunction bipolar transistor (HBT) and a final-stage HBT, respectively. Vc1 and Vc2 denote collector power supply terminals for the transistors Tr1 and Tr2, respectively. Vcb denotes a power supply terminal of a bias circuit of Tr1 and Tr2. Vref denotes a reference voltage input terminal of the bias circuit. Rb1, Rb2, Rb12 and Rb22 denote resistors. C1 to C4, C21 to C23, Cd1, Cd2 and Cdb denote capacitors. L1 and L2 denote inductors. L11 and L21 to L23 denote lines having particular electrical lengths and functioning as inductors.

FIG. 7B shows a concrete example of a circuit configuration of the final-stage transistor Tr2 and a circuit portion for biasing the transistor Tr2. (The initial-stage transistor Tr1 and a circuit portion for biasing the transistor Tr1 have substantially the same circuit configuration.) Trb1 to Trb5 denote HBTs. Rbb1 to Rbb6 denote resistors. Vrefb denotes a reference voltage input terminal (a terminal to which a reference voltage is externally applied) of the bias circuit. Vcb denotes a collector power supply terminal for the bias circuit. Vbo denotes an output terminal of the bias circuit. This bias circuit operates so as to constantly maintain the idling current through Tr1 and Tr2 for the power amplifier (bias current when no RF signal input is supplied) under varying temperature.

For the normal operation of the bias circuit for the power amplifier shown in FIGS. 7A and 7B, a reference voltage Vref higher than twice the barrier voltage of the HBTs, typified by that in the two-stage cascaded section formed of Trb4 and Trb5 in a diode connection Tr or that in the two-stage cascaded section formed of the final-stage Tr2 and the Trb1, is required. That is, in a case where GaAs HBTs are used, a Vref of about 2.7 to 2.9 V is required from consideration of a barrier voltage of about 1.25 to 1.30 V and a voltage drop of about 0.2 to 0.3 V across the resistor Rbb1.

Figure 8A:
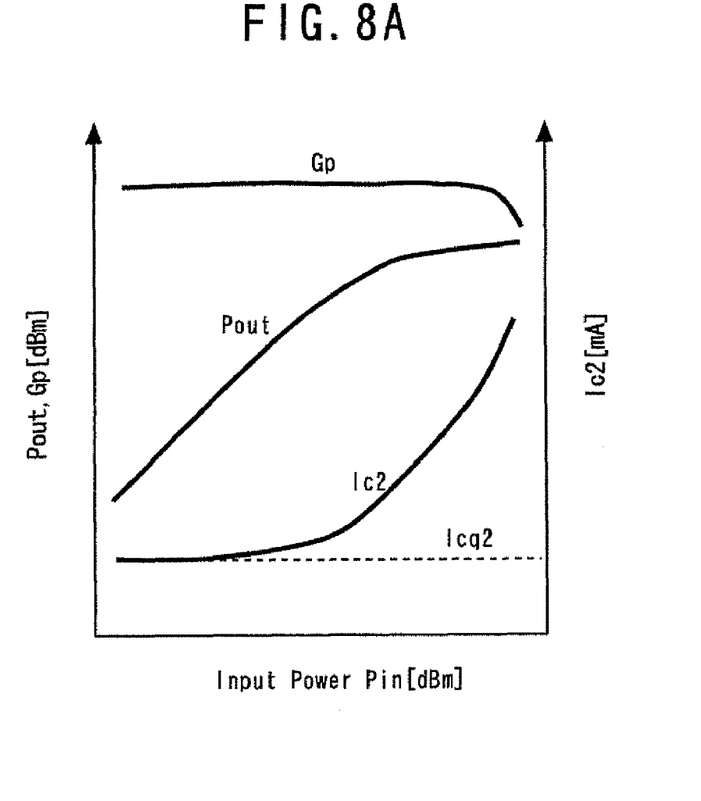
FIG. 8A shows input/output characteristics of the Tr2 for the power amplifier using the bias circuit shown in FIGS. 7A and 7B.
Figure 8B:
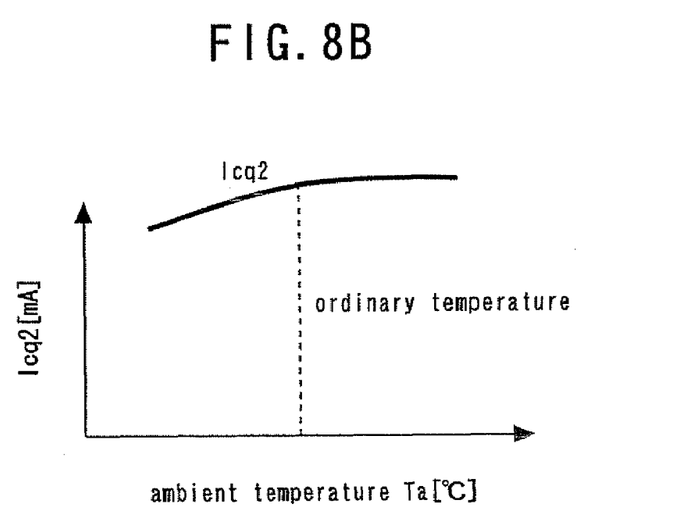
FIG. 8B shows a temperature dependence of idling current Icq2 of the bias circuit shown in FIGS. 7A and 7B.

FIG. 8A shows an example of input/output characteristics of the power amplifier shown in FIGS. 7A and 7B. FIG. 8B shows an example of temperature dependence of idling current Icq2 through the final-stage Tr2 (operating current when no RF signal input is supplied). In a power amplifier for a portable telephone in which an idling current flows at all times like in CDMA use, the magnitude of the idling current largely influences the maximum talk time of the portable telephone. Therefore, circuit constants are designed so that the desired output power (about 26 to 28 dBm) is obtained at a low idling current value. The Trb1 forming the emitter follower is a device having the function of absorbing the difference between the low base current of the Tr2 when the idling current is low and the high base current of the Tr2 during high-output operation.

A concrete example of variation in Icq2 with respect to temperature in use of the bias circuit shown in FIG. 7B will be described. If Icq2 is about 25 mA at ordinary temperature, it is about 20 mA at a temperature in the range from a low temperature to 25° C., and is about 28 mA at a high temperature of 85° C. Thus, the circuit shown in FIG. 7B is capable of effectively limiting variation in Icq2 with respect to temperature and it is considered that there is no problem with the circuit in practice if Vref of about 2.8 to 2.9 is applied.

In the bias circuit shown in FIG. 7B, however, no idling current flows even at ordinary temperature when Vref is reduced to a value lower than about twice the barrier voltage of the HBTs, i.e., about 2.5 V. For this reason, the bias circuit shown in FIG. 7B cannot be used in practice without being modified. This tendency of the idling current to stop becomes stronger as the temperature decreases because the barrier voltage determined by device materials is increased as the temperature decreases. The temperature dependence of the barrier voltage ordinarily has a gradient of about −1 to −2 mV/° C.

With the conventional bias circuit for a GaAs-HBT power amplifier, there has been a problem that the idling current does not flow at ordinary or low temperature when the reference voltage Vref is reduced to a value lower than about twice the barrier voltage of the HBTs, as described above.

SUMMARY OF THE INVENTION

The present invention has been developed to solve the above-described problems, and therefore it is an object of the present invention to provide a power amplifier bias circuit formed integrally on a GaAs chip to enable the desired amplifying operation by generally constantly maintaining the idling current through an HBT from a low temperature to a high temperature even when the reference voltage Vref is reduced to a value lower than about twice the barrier voltage of the HBT.

The above object is achieved by a power amplification bias circuit that includes an amplifying transistor, and a bias circuit for supplying a bias current to a base terminal of the amplifying transistor, and the bias circuit includes a reference voltage input terminal through which a reference voltage is input from the outside, a first transistor which supplies a bias current according to the reference voltage to the base terminal of the amplifying transistor, a second transistor having its collector terminal connected to a connection point between the first transistor and the base terminal of the amplifying transistor via a first resistor and having its emitter grounded, a third transistor having its base terminal connected to the reference voltage input terminal via a second resistor, the third transistor supplying a bias current according to the reference voltage to a base terminal of the second transistor, a fourth transistor having its base terminal connected to an emitter terminal of the first transistor, its emitter terminal grounded and its collector terminal connected to the reference voltage input terminal via a third resistor, and a fourth resistor having its one terminal connected to the reference voltage input terminal and having the other terminal connected to the base terminal of the amplifying transistor, wherein a current is supplied from the reference voltage terminal to the base terminal of the amplifying transistor via the fourth resistor when the reference voltage is lower than a voltage at which the first transistor operates.

The power amplifier bias circuit formed integrally on a GaAs chip according to the present invention ensures the desired amplifying operation by maintaining the idling current generally constantly from a low temperature to a high temperature even when the reference voltage Vref is reduced to a value lower than twice the barrier voltage of the HBT.

Other features and advantages of the invention will be apparent from the following description taken in connection with the accompanying drawings.

DETAILED DESCRIPTION OF THE PREFERRED EMBODIMENTS

Embodiments of the present invention will be described below referring to the drawings. In the drawings, the same or equivalent parts will be denoted by the same reference numerals, and the description thereof will be simplified or omitted.

First Embodiment

Figure 1:
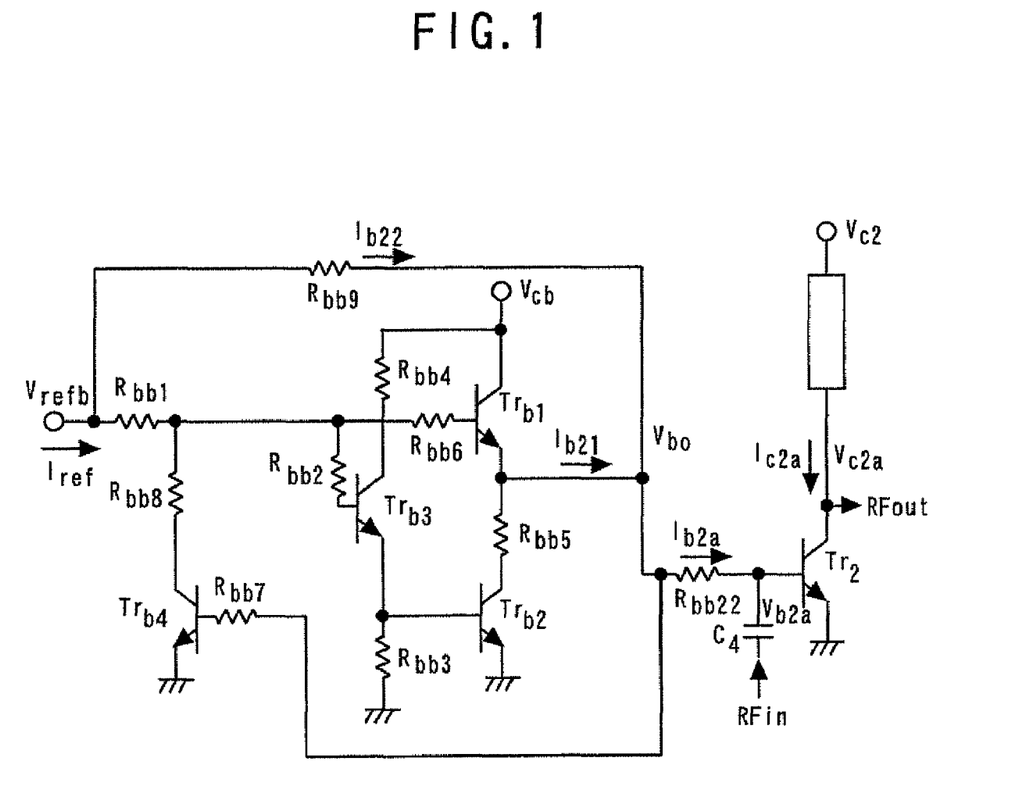
FIG. 1 shows a bias circuit for a power amplifier according to the first embodiment.

FIG. 1 shows a bias circuit for a power amplifier according to a first embodiment of the present invention. In this circuit, a GaAs-heterojunction bipolar transistor (hereinafter referred to as "HBT") is used as a transistor. This circuit has a reference voltage input terminal (Vrefb) for externally applying a reference voltage. Vcb denotes a collector power supply terminal of the bias circuit. Vbo denotes an output terminal of the bias circuit. Trb1 to Trb4 denote GaAs-HBTs for the bias circuit. Tr2 denotes a final-stage amplifying transistor. Rbb1 to Rbb9 denote resistors. In this manner, the bias circuit for supplying a bias current to the base terminal of the transistor Tr2 is connected.

The emitter terminal of the Trb1 (first transistor) is connected to the base terminal of the Tr2 to supply a bias current according to a reference voltage Vrefb. The base terminal of the Trb1 is connected to the reference voltage input terminal (Vrefb) via the Rbb1 and Rbb6. The collector terminal of the Trb1 is connected to the collector power supply terminal (first power supply terminal) Vcb.

The collector terminal of the Trb2 (second transistor) is connected to a connection point between the emitter terminal of the Trb1 and the base terminal of the Tr2 via the Rbb5 (first resistor). The emitter terminal of the Trb2 is grounded.

The base terminal of the Trb3 (third transistor) is connected to the terminal Vrefb via the Rbb1 (second resistor) and the Rbb2. The collector terminal of the Trb3 is connected to the terminal Vcb via the Rbb4. The emitter terminal of the Trb3 is connected to the base terminal of the Trb2. The Trb3 can supply to the base terminal of the Trb2 a bias current according to the reference voltage.

The base terminal of the Trb4 (fourth transistor) is connected to the emitter terminal of the Trb1 via the Rbb7. The collector terminal of the Trb4 is connected to the reference voltage input terminal (Vrefb) via the Rbb1 (second resistor) and the Rbb8 (third resistor). The emitter terminal of the Trb4 is grounded. The base terminal of the Trb4 is connected to the base terminal of the Tr2 via the Rbb7 and the Rb22. The Trb4 constitutes a monitoring portion of an idling current limiting circuit at a high temperature and is connected to the terminal Vbo via the Rbb7.

In the above-described circuit, the Rbb9 (fourth resistor) is connected between the terminal Vrefb and the terminal Vbo. One terminal of the Rbb9 is connected to the terminal Vrefb while the other terminal of the Rbb9 is connected to the base terminal of the Tr2 via the Rbb22, thereby enabling supply of the current from the reference voltage input terminal (Vrefb) to the base terminal of the Tr2 via the resistor Rbb9 in a state in which the voltage applied to the reference voltage input terminal (Vrefb) is lower than the voltage at which the Trb1 operates (hereinafter referred to as "idling state"). As a result, the idling current can be supplied to the Tr2 even at a low reference voltage at which the Trb1 does not operate.

Figure 2A:
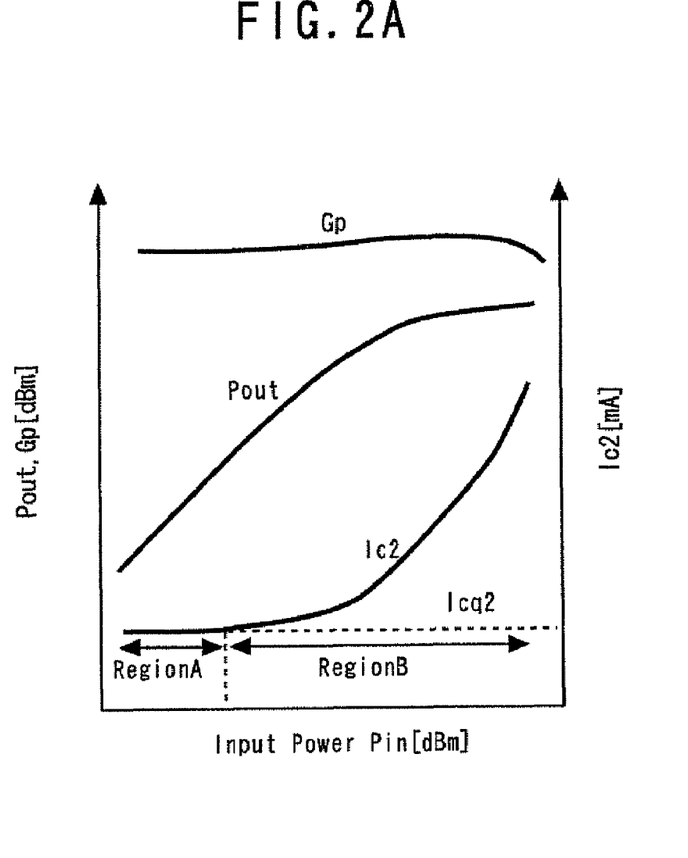
FIG. 2A shows input/output characteristics of the Tr2 for the power amplifier using the bias circuit shown in FIG. 1.

FIG. 2A shows input/output characteristics of the Tr2 for the power amplifier using the bias circuit shown in FIG. 1. In a region A shown in FIG. 2A, the Tr2 performs the amplifying operation by base current Ib22 directly injected through the Rbb9. In a region B, operating current Ic2 starts increasing and the emitter follower circuit formed by the Trb1 mainly supplies base current Ib21 to the Tr2, thus achieving the amplifying operation. In this region, certain input power is applied to enable the emitter follower circuit, which does not operate at the initial stage, to operate. This is because the average of the base voltage on the Tr2 becomes lower than the level in the idling state as the input power increases.

Use of the bias circuit in this embodiment ensures that characteristics equivalent to those shown in FIG. 8A can be achieved with a low reference voltage Vref=2.4 to 2.5 V. Thus, the reference voltage for the HBT power amplifier in which the above-described bias circuit is integrally formed on a GaAs substrate can be reduced to 2.4 to 2.5 V.

Figure 2B:
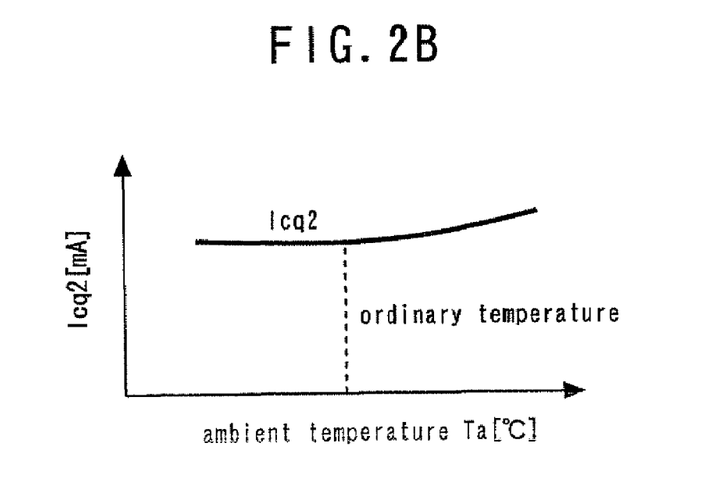
FIG. 2B shows a temperature dependence of idling current Icq2 of the bias circuit shown in FIG. 1.

In this embodiment, the circuit formed of the Trb4, Rbb7 and Rbb8 is provided in place of the Trb4 and the Trb5( ) shown in FIG. 7B. FIG. 2B shows a temperature dependence of idling current Icq2 in this case. As can be understood from this result, the increase in Icq2 (idling current) is limited at a temperature lower than ordinary temperature. Thus, an idling current temperature dependence characteristic strongly demanded in CDMA use, i.e., the effect of constantly maintaining the idling current with respect to temperature, can be achieved.

The power amplifier bias circuit according to this embodiment ensures the desired amplifying operation by maintaining the idling current generally constantly from a low temperature to a high temperature even when the reference voltage Vref is reduced to a value lower than twice the barrier voltage of the HBT.

Second Embodiment

Figure 3:
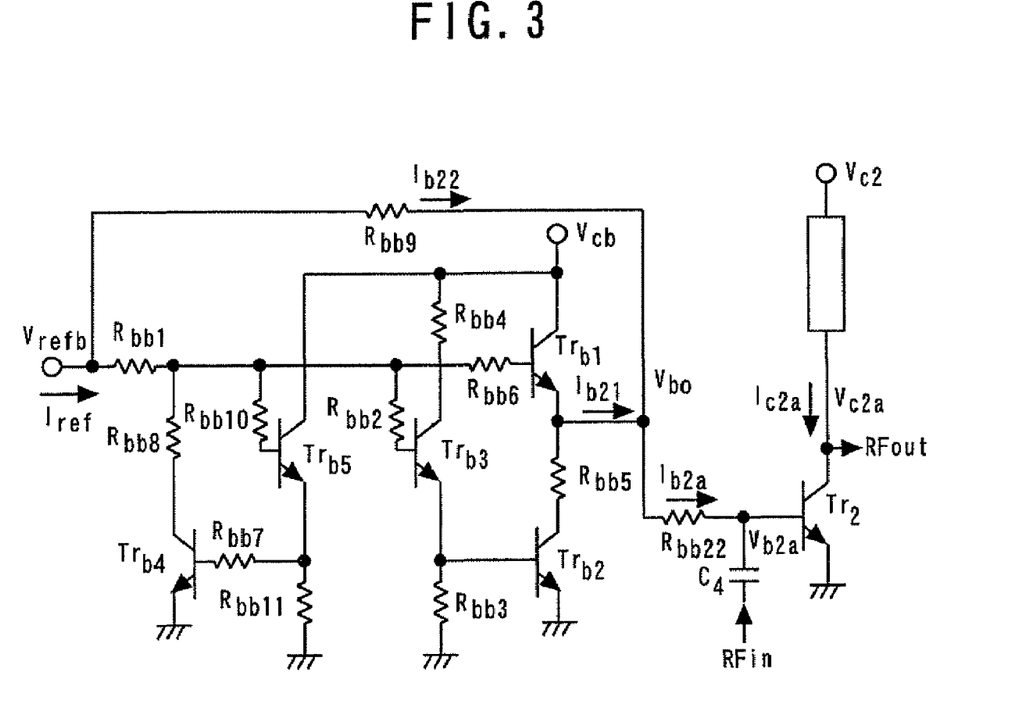
FIG. 3 shows a bias circuit for a power amplifier according to the second embodiment.

FIG. 3 shows a bias circuit for a power amplifier according to a second embodiment of the present invention. This embodiment will be described with respect to a point of difference from the first embodiment. In this embodiment, a transistor Trb5 (fifth transistor) and resistors Rbb10 and Rbb11 are added to the circuit in the first embodiment (see FIG. 1). The base terminal of the Trb5 is connected to the reference voltage input terminal (Vrefb) via the Rbb10 and Rbb1. The collector terminal of the Trb5 is connected to the power supply terminal Vcb. The emitter terminal of the Trb5 is connected to the base terminal of the Trb4 via the Rbb7 and is grounded via the Rbb11. In the first embodiment, the monitoring portion of the idling current limiting circuit formed by the Trb4 to limit the idling current at a high temperature is connected to the terminal Vbo via the Rbb7. In this embodiment, a dummy circuit formed of the Trb5, Rbb10 and Rbb11 is provided in place of this circuit portion to use the emitter voltage of the Trb5 in place of Vbo.

In the above-described arrangement, the above-described monitoring portion is separated from Vbo influenced by the RF signal. Thus, the effect of stabilizing the RF circuit section is achieved as well as the effect of the first embodiment. Also, an individual DC bias circuit design can be made by considering a temperature characteristic.

Third Embodiment

Figure 4:
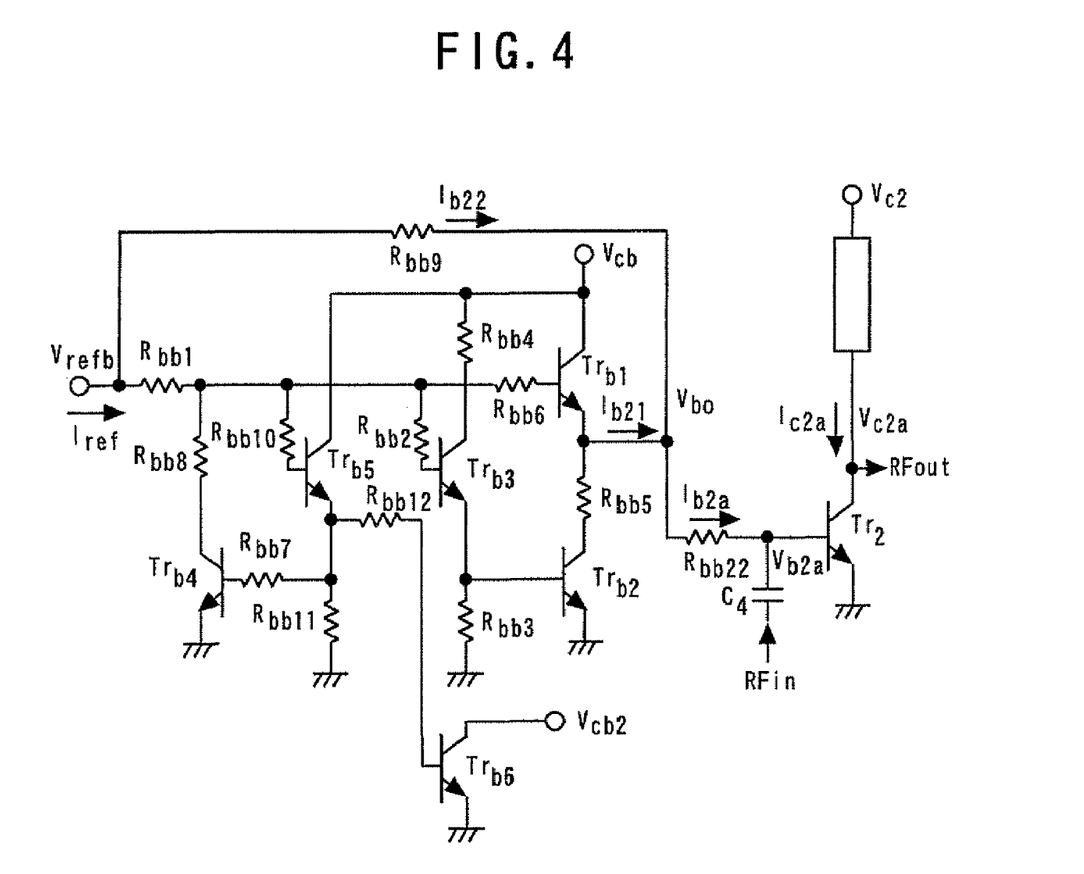
FIG. 4 shows a bias circuit for a power amplifier according to the third embodiment.

FIG. 4 shows a bias circuit for a power amplifier according to a third embodiment of the present invention. This embodiment will be described with respect to a point of difference from the second embodiment. In this embodiment, a sixth transistor Trb6 and a resistor Rbb12 are added to the circuit in the second embodiment (see FIG. 3). That is, the Trb6 and the Rbb12 are provided on the high-temperature idling current limiting portion formed by the Trb5 and the Trb4 in the circuit (see FIG. 3) in the second embodiment. The base terminal of the Trb6 is connected to the emitter terminal of the Trb5 via the Rbb12. The collector terminal of the Trb6 is connected to a power supply terminal Vcb2. The emitter terminal of the Trb6 is grounded. In other respects, the configuration is the same as that in the second embodiment.

The above-described configuration ensures the operation of the Tr2 can be simulated with the Trb6. In this way, the effect of improving the accuracy of the idling current variation limiting operation is achieved as well as the effects of the second embodiment.

Fourth Embodiment

Figure 5:
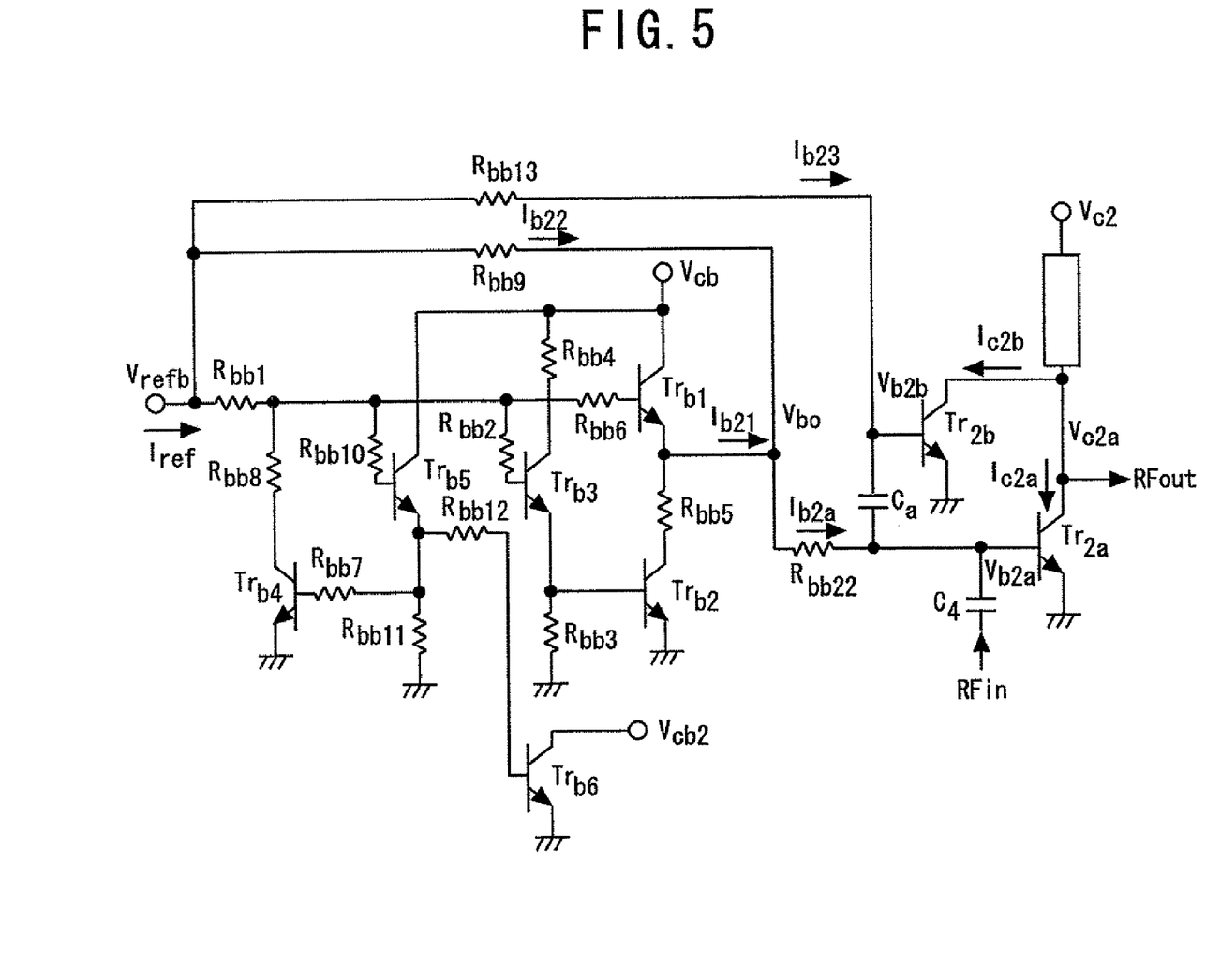
FIG. 5 shows a bias circuit for a power amplifier according to the fourth embodiment.

FIG. 5 shows a bias circuit for a power amplifier according to a fourth embodiment of the present invention. This embodiment will be described with respect to a point of difference from the third embodiment. In this embodiment, the Tr2 of the circuit in the third embodiment (see FIG. 4) is replaced with a transistor Tr2a, to which a transistor Tr2b of a smaller emitter size (seventh transistor) is connected. The collector terminal of the Tr2b is connected to the collector terminal of the Tr2a. The base terminal of the Tr2b is connected to the base terminal of the Tr2a via a capacitor Ca. That is, the base terminals of the Tr2a and the Tr2b are separated from each other in a DC manner by using the capacitor Ca to separate the bias circuits of Tr2a and Tr2b. Also, a fifth resistor Rbb13 is added. One terminal of the Rbb13 is connected to the reference voltage input terminal (Vrefb), while the other terminal of the Rbb13 is connected to the base terminal of the Tr2b. That is, a base current Ib23 can be supplied from Vrefb to the base terminal of the Tr2b via the resistor Rbb13. In other respects, the configuration is the same as that in the third embodiment.

That is, the above-described circuit is provided with the amplifying transistor Tr2a driven by a combination bias circuit in which a voltage drive bias circuit typified by an emitter follower and a current-drive bias circuit for directly supplying a base current from the reference voltage input to the base via a high-resistance resistor are provided in parallel with each other. Further, the amplifying transistor Tr2b operated by current drive only is provided in parallel with the amplifying transistor Tr2a.

In the above-described arrangement, base current Ib23 is supplied from the reference voltage input terminal (Vrefb) to the base terminal of the Tr2b via the Rbb13 in the idling state. The Tr2b can be operated by this current. The provision of the Tr2b separated from the Tr2a in a DC manner ensures that the increase in power gain Gp in the region B shown in FIG. 2A can be reduced by Gp given to the Tr2b portion.

The power amplifier bias circuit according to this embodiment has the effect of limiting variation in power gain Gp with respect to input power as well as the effect obtained in the first embodiment.

Fifth Embodiment

A bias circuit for a power amplifier according to a fifth embodiment of the present invention is configured in such a manner that a current drive section is provided in parallel with the Tr2a in the circuit in the first embodiment (see FIG. 1) as described above with respect to the fourth embodiment (see FIG. 5). That is, this circuit is formed by adding the Tr2b and Rbb13 (see FIG. 5) to the circuit described as the first embodiment (see FIG. 1).

In the above-described arrangement, base current Ib23 is supplied from the reference voltage input terminal (Vrefb) to the base terminal of the Tr2b via the Rbb13 in the idling state. The Tr2b can be operated by this current.

The power amplifier bias circuit according to this embodiment has the effect of limiting variation in power gain Gp with respect to input power as well as the effect obtained in the first embodiment.

Sixth Embodiment

A bias circuit for a power amplifier according to a sixth embodiment of the present invention is configured in such a manner that a current drive section is provided in parallel with the Tr2a in the circuit in the second embodiment (see FIG. 3) as described above with respect to the fourth embodiment (see FIG. 5). That is, this circuit is formed by adding the Tr2b and Rbb13 (see FIG. 5) to the circuit described as the second embodiment (see FIG. 3).

In the above-described arrangement, base current Ib23 is supplied from the reference voltage input terminal (Vrefb) to the base terminal of the Tr2b via the Rbb13 in the idling state. The Tr2b can be operated by this current.

The power amplifier bias circuit according to this embodiment has the effect of limiting variation in power gain Gp with respect to input power as well as the effects obtained in the second embodiment.

Seventh Embodiment

Figure 9:
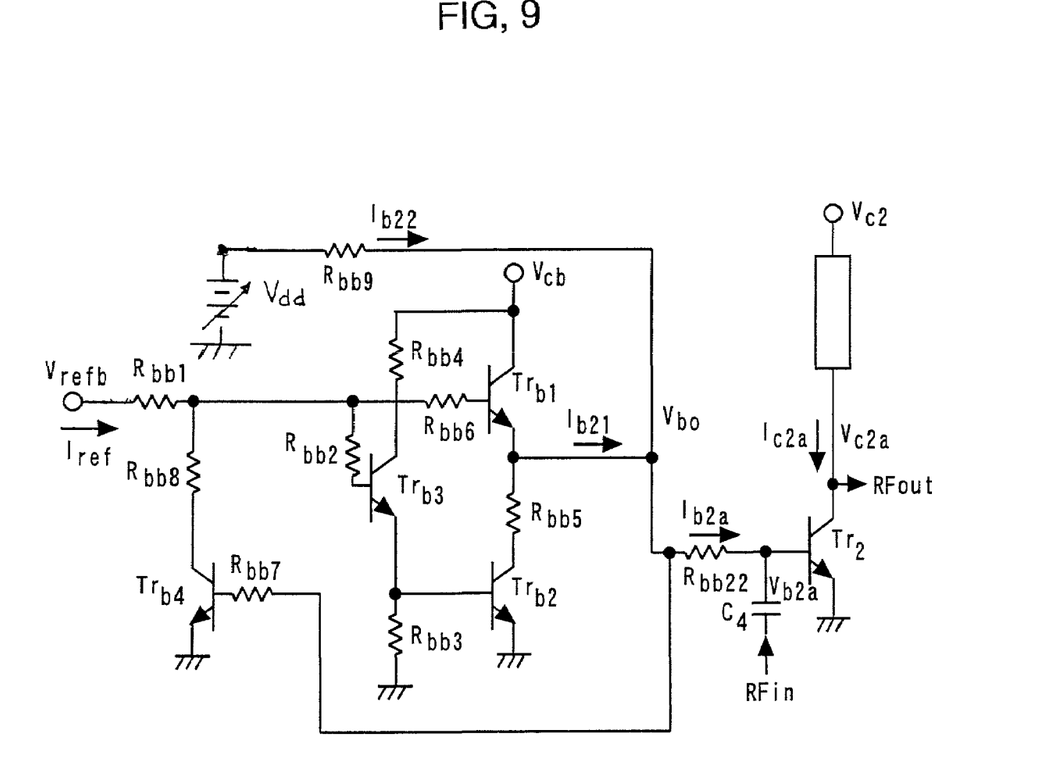
FIG. 9 shows a bias circuit for a power amplifier according to the seventh embodiment.

A bias circuit for a power amplifier according to a seventh embodiment of the present invention is configured as shown in FIG. 9. The circuit described as the first embodiment (see FIG. 1) is modified so that one end of the resistor Rbb9 is connected not to the reference voltage input terminal Vrefb as in FIG. 1, but to a DC power supply Vdd. In this circuit, one terminal of the resistor Rbb9 is connected to the DC power supply Vdd (at a first power supply terminal of first and second power supply terminals of the DC power supply Vdd) different from the reference voltage input terminal (Vrefb) while the other terminal of the resistor Rbb9 is connected to the base terminal of the Tr2 via the Rb22. Thus, a current can be supplied from the DC power supply Vdd, which is different from the reference voltage input terminal (Vrefb) of FIG. 1, to the base terminal of the Tr2 via the resistor Rbb9.

In the circuit shown in FIG. 1, the value of the base current supplied to the Tr2 via the Rbb9 is uniquely determined by the Vref value. That is, the gain of the Tr2 in the idling state is determined only by the idling current, as shown in FIG. 2A. If the current flowing the Rbb9 is supplied from the power supply Vdd, gain control with respect to varying temperature can be performed more finely.

More specifically, the circuit according to this embodiment can be implemented by connecting, for example, to a current mirror circuit using a pMOS transistor or a pnp transistor, the terminal of the Rbb9 corresponding to that connected to the terminal Vrefb in FIG. 1. In the design of this circuit, only the voltage drop due to the barrier voltage of the Tr2 and the resistor may be considered. As a result, the operation using a low power supply voltage of 2.4 to 2.5 V can be performed as well as that using Vref.

The power amplifier bias circuit according to this embodiment provides more accurate power gain control during idle current operation using an external circuit in addition to the effect of the first embodiment.

Eighth Embodiment

Figure 10:
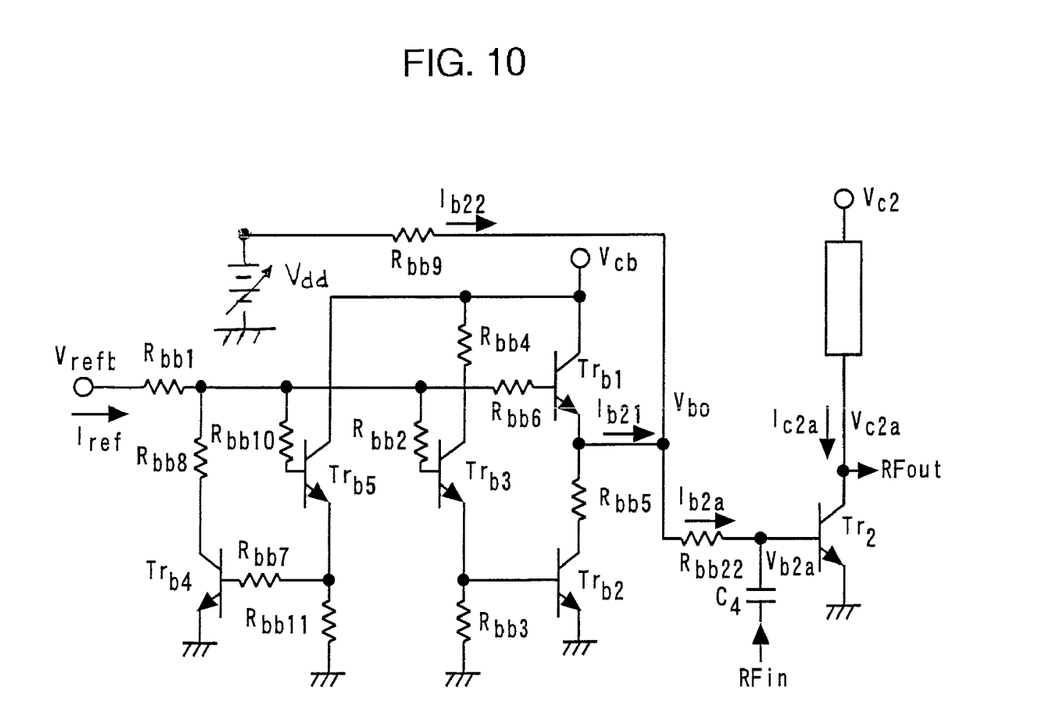
FIG. 10 shows a bias circuit for a power amplifier according to the eighth embodiment.

A bias circuit for a power amplifier according to an eighth embodiment of the present invention is obtained by modifying, in the circuit according to the second embodiments the arrangement using a different terminal for the current drive section, just as described with respect to the seventh embodiment. This circuit, shown in FIG. 10, is formed by connecting to a DC power supply Vdd the terminal of the Rbb9 corresponding to the terminal connected to the terminal Vrefb in the circuit described as the second embodiment and shown in FIG. 3.

The power amplifier bias circuit according to this embodiment has the effect of stabilizing the RF circuit section as well as the above-described effects of the seventh embodiment. Also according to this embodiment, an individual DC bias circuit design can be made by considering a temperature characteristic.

Ninth Embodiment

Figure 11:
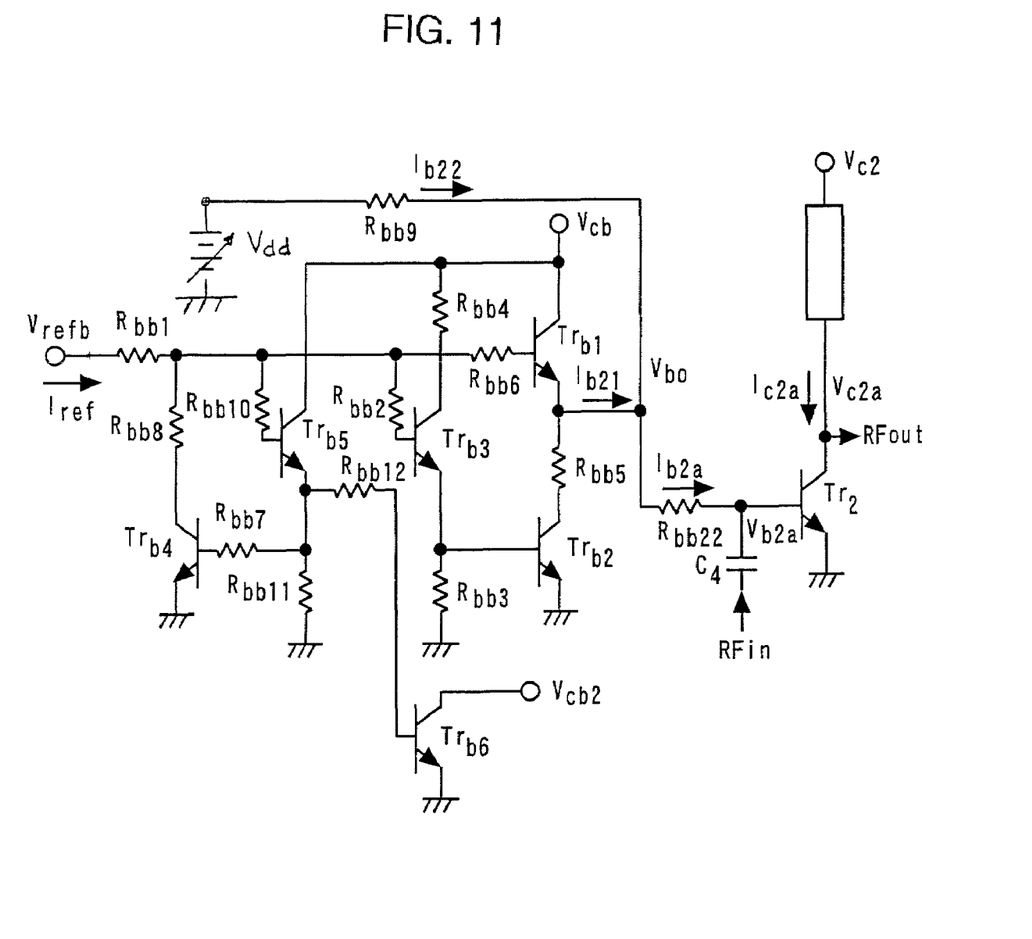
FIG. 11 shows a bias circuit for a power amplifier according to the ninth embodiment.

A bias circuit for a power amplifier according to a ninth embodiment of the present invention is obtained by implementing in the circuit in the third embodiment the arrangement using a different terminal for the current drive section as described with respect to the seventh embodiment. This circuit, shown in FIG. 11, is formed by connecting to a DC power supply Vdd the terminal of the Rbb9 corresponding to the terminal connected to the terminal Vrefb in the circuit described as the third embodiment and shown in FIG. 4.

The power amplifier bias circuit according to this embodiment has the effect of limiting variation in idling current with further improved accuracy as well as the above-described effects of the seventh embodiment.

Tenth Embodiment

Figure 12:
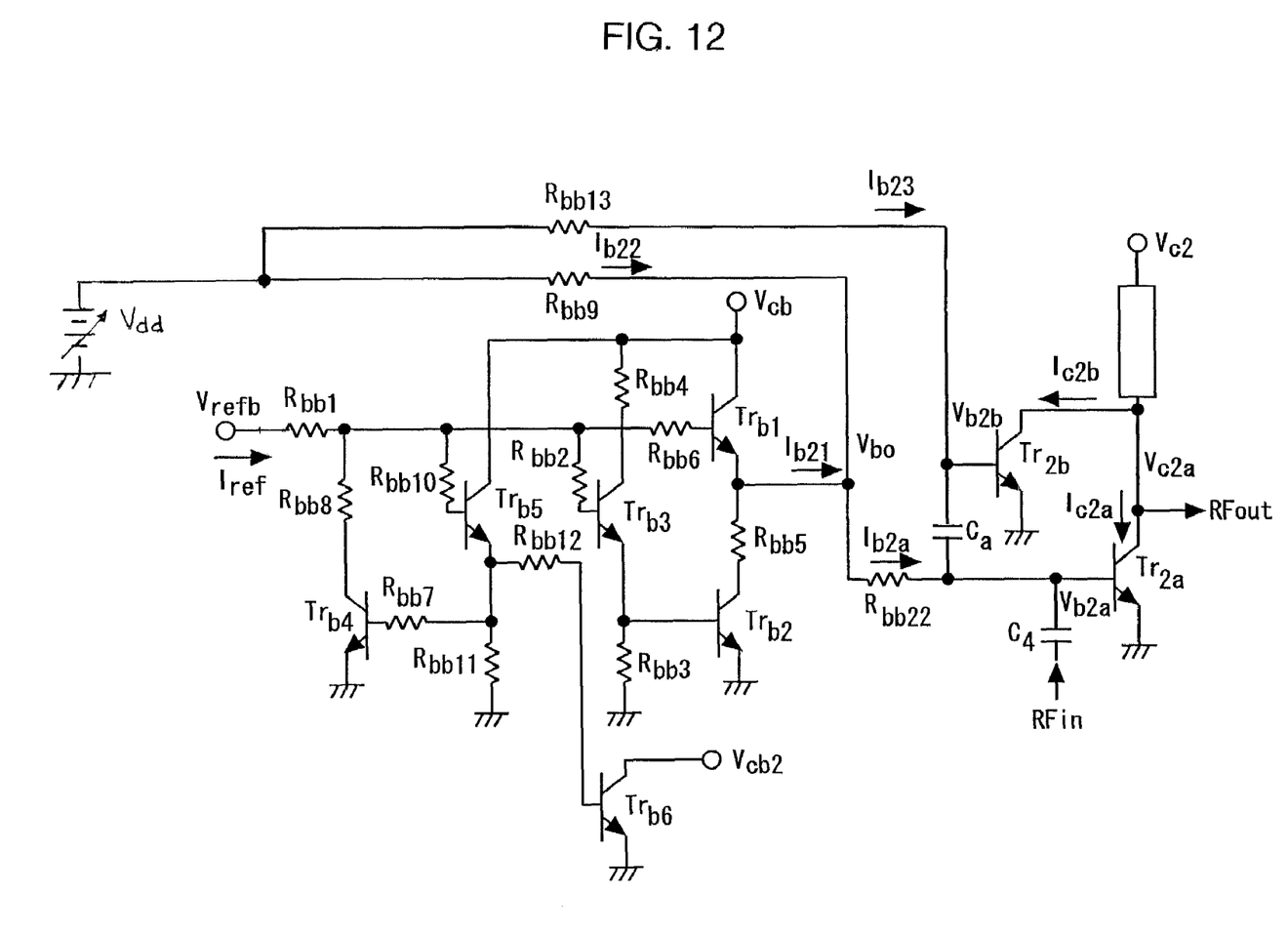
FIG. 12 shows a bias circuit for a power amplifier according to the tenth embodiment.

A bias circuit for a power amplifier according to a tenth embodiment of the present invention is obtained by implementing in the circuit in the fourth embodiment the arrangement using a different terminal for the current drive section as described with respect to the seventh embodiment. This circuit, shown in FIG. 12, is formed by connecting to a DC power supply Vdd the terminal of the Rbb9 corresponding to the terminal connected to the terminal Vrefb in the circuit described as the fourth embodiment and shown in FIG. 5.

The power amplifier bias circuit according to this embodiment has the effect of limiting variation in power gain Gp with respect to input power as well as the above-described effects of the seventh embodiment.

Eleventh Embodiment

A bias circuit for a power amplifier according to an eleventh embodiment of the present invention is obtained by implementing in the circuit in the fifth embodiment the arrangement using a different terminal for the current drive section as described with respect to the seventh embodiment. This circuit (not shown) is formed by adding Tr2b and Rbb13 (see FIG. 5) to the circuit in the first embodiment (see FIG. 1) and by connecting to a different DC power supply the terminal of the Rbb9 corresponding to that connected to the terminal Vrefb.

The power amplifier bias circuit according to this embodiment has the effect of limiting variation in power gain Gp with respect to input power as well as the above-described effects of the seventh embodiment.

Twelfth Embodiment

A bias circuit for a power amplifier according to a twelfth embodiment of the present invention is obtained by implementing in the circuit in the sixth embodiment the arrangement using a different terminal for the current drive section as described with respect to the seventh embodiment. This circuit (not shown) is formed by adding Tr2b and Rbb13 (see FIG. 5) to the circuit in the second embodiment (see FIG. 3) and by connecting to a different DC power supply the terminal of the Rbb9 corresponding to that connected to the terminal Vrefb.

The power amplifier bias circuit according to this embodiment has the effect of limiting variation in power gain Gp with respect to input power as well as the above-described effects of the seventh embodiment.

Thirteenth Embodiment

Figure 6:
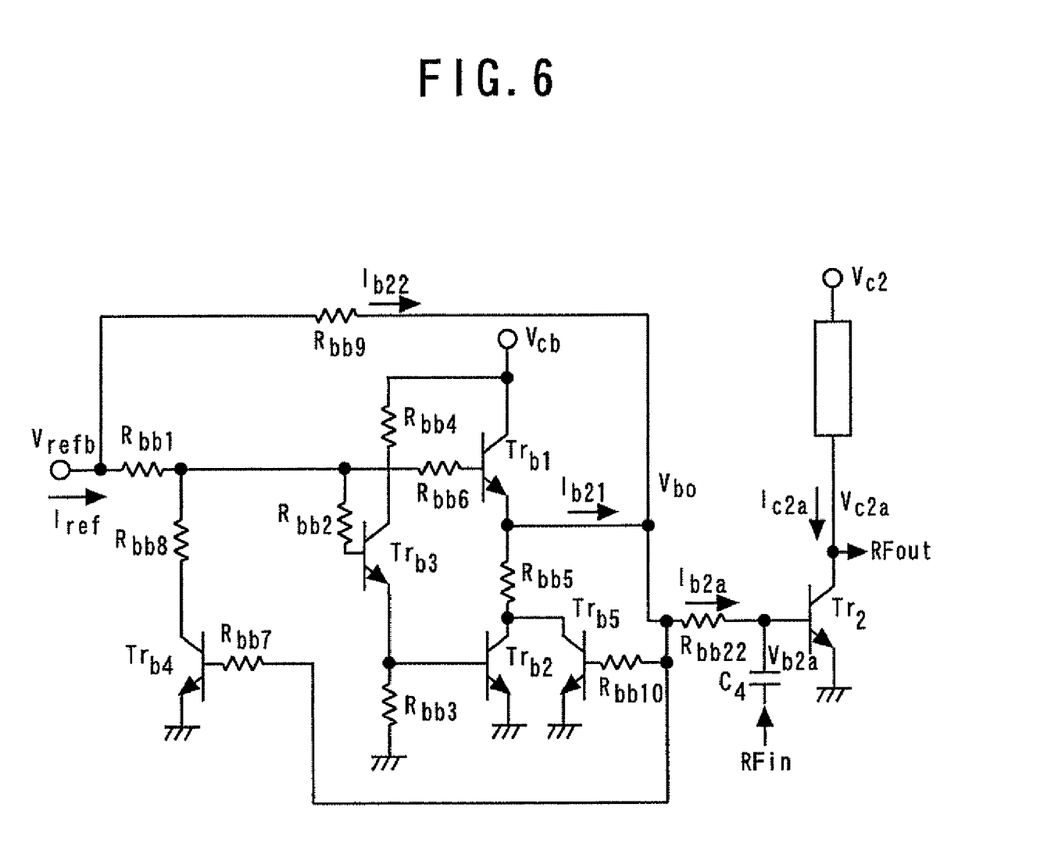
FIG. 6 shows a bias circuit for a power amplifier according to the thirteenth embodiment.

FIG. 6 shows a bias circuit for a power amplifier according to a thirteenth embodiment of the present invention. This embodiment will be described with respect to a point of difference from the first embodiment. In this embodiment, a transistor Trb5 (eighth transistor) and a resistor Rbb10 are added to the circuit in the first embodiment. The base terminal of the Trb5 is connected to the emitter terminal of the Trb1 via the Rbb10 and to the base terminal of the Trb4 via the Rbb10 and the Rbb7. That is, the resistor Rbb10 and the Trb5 are provided between the Vbo portion and the Rbb5. In other respects, the configuration is the same as that in the first embodiment.

The above-described configuration ensures that the current supplied to the base terminal of the Tr2 can be limited to a value equal to or lower than a predetermined value when the power amplifier bias circuit is used at a high temperature equal to or higher than a predetermined temperature.

The power amplifier bias circuit according to this embodiment is capable of limiting the increase in idling current more effectively in use at a high temperature while having the above-described effect of the first embodiment.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-323349, filed on Nov. 5, 2005 including specification, claims, drawings and summary, on which the Convention priority of the present application is based, are incorporated herein by reference in its entirety.

The invention claimed is:

1. A power amplification bias circuit comprising:
    an amplifying transistor having an emitter terminal, a base terminal, and a collector terminal; and
    a bias circuit for supplying a bias current to the base terminal of the amplifying transistor, the bias circuit including:
        a reference voltage input terminal through which a reference voltage is input from outside;
        a first transistor having an emitter terminal and which supplies a bias current according to the reference voltage to the base terminal of the amplifying transistor;
        first, second, and third resistors;
        a second transistor having a base terminal, an emitter terminal that is grounded, and a collector terminal that is connected to a connection point between the first transistor and the base terminal of the amplifying transistor via the first resistor;
        a third transistor having a base terminal connected to the reference voltage input terminal via the second resistor, the third transistor supplying a bias current according to the reference voltage to the base terminal of the second transistor;
        a fourth transistor having a base terminal connected to the emitter terminal of the first transistor, an emitter terminal that is grounded, and a collector terminal connected to the reference voltage input terminal via the third resistor; and
        a fourth resistor having a first terminal connected to the reference voltage input terminal and having a second terminal connected to the base terminal of the amplifying transistor, wherein a current is supplied from the reference voltage terminal to the base terminal of the amplifying transistor via the fourth resistor when the reference voltage is lower than a voltage at which the first transistor operates.

2. The power amplification bias circuit according to claim 1, the bias circuit further including a fifth transistor having a base terminal connected to the reference voltage input terminal, a collector terminal connected to a first power supply terminal, and an emitter terminal connected to the base terminal of the fourth transistor.

3. The power amplification bias circuit according to claim 2, the bias circuit further including a sixth transistor having a base terminal connected to the emitter terminal of the fifth transistor, the sixth transistor simulating operation of the amplifying transistor.

4. The power amplification bias circuit according to claim 1, the bias circuit further including:
    a capacitance element;
    a fifth transistor having a collector terminal connected to the collector terminal of the amplifying transistor and a base terminal connected to the base terminal of the amplifying transistor via the capacitance element; and
    a fifth resistor having a first terminal connected to the reference voltage input terminal and having a second terminal connected to the base terminal of the fifth transistor, wherein the fifth transistor is operated by a current supplied from the reference voltage input terminal to the base terminal of the fifth transistor via the fifth resistor when the voltage applied to the reference voltage input terminal is lower than a voltage at which the first transistor operates.

5. The power amplification bias circuit according to claim 2, the bias circuit further including:
    a capacitance element;
    a sixth transistor having a collector terminal connected to the collector terminal of the amplifying transistor and a base terminal connected to the base terminal of the amplifying transistor via the capacitance element; and
    a fifth resistor having a first terminal connected to the reference voltage input terminal and having a second terminal connected to the base terminal of the sixth transistor, wherein the sixth transistor is operated by a current supplied from the reference voltage input terminal to the base terminal of the sixth transistor via the fifth resistor when the voltage applied to the reference voltage input terminal is lower than a voltage at which the first transistor operates.

6. The power amplification bias circuit according to claim 3, the bias circuit further including:
    a capacitance element;
    a seventh transistor having a collector terminal connected to the collector terminal of the amplifying transistor and a base terminal connected to the base terminal of the amplifying transistor via the capacitance element; and
    a fifth resistor having a first terminal connected to the reference voltage input terminal and having a second terminal connected to the base terminal of the seventh transistor, wherein the seventh transistor is operated by a current supplied from the reference voltage input terminal to the base terminal of the seventh transistor via the fifth resistor when the voltage applied to the reference voltage input terminal is lower than a voltage at which the first transistor operates.

7. The power amplification bias circuit according to claim 1, the bias circuit further including a fifth transistor having a base terminal connected to the emitter terminal of the first transistor and to the base terminal of the fourth transistor, wherein the current supplied to the base of the amplifying transistor is set to a value equal to or lower than a predetermined value during use at a temperature equal to or higher than a predetermined temperature.

8. A power amplification bias circuit comprising:
an amplifying transistor having an emitter terminal, a base terminal, and a collector terminal; and
a bias circuit for supplying a bias current to the base terminal of the amplifying transistor, the bias circuit including:
a power supply having first and second power supply terminals;
a reference voltage input terminal through which a reference voltage is input from outside;
a first transistor having an emitter terminal and which supplies a bias current according to the reference voltage to the base terminal of the amplifying transistor;
first, second, and third resistors;
a second transistor having an emitter terminal that is grounded, a base terminal, and a collector terminal that is connected to a connection point between the first transistor and the base terminal of the amplifying transistor via the first resistor;
a third transistor having a base terminal connected to the reference voltage input terminal via the second resistor, the third transistor supplying a bias current according to the reference voltage to the base terminal of the second transistor;
a fourth transistor having a base terminal connected to the emitter terminal of the first transistor, an emitter terminal that is grounded, and a collector terminal connected to the reference voltage input terminal via the third resistor; and
a fourth resistor having a first terminal connected to the first power supply terminal and having a second terminal connected to the base terminal of the amplifying transistor, wherein a current is supplied from the first power supply terminal to the base terminal of the amplifying transistor via the fourth resistor when the reference voltage is lower than a voltage at which the first transistor operates.

9. The power amplification bias circuit according to claim 8, the bias circuit further including a fifth transistor having a base terminal connected to the reference voltage input terminal, a collector terminal connected to the second power supply terminal, and an emitter terminal connected to the base terminal of the fourth transistor.

10. The power amplification bias circuit according to claim 9, the bias circuit further including a sixth transistor having a base terminal connected to the emitter terminal of the fifth transistor, the sixth transistor simulating operation of the amplifying transistor.

11. The power amplification bias circuit according to claim 8, the bias circuit further including:
a capacitance element;
a fifth transistor having a collector terminal connected to the collector terminal of the amplifying transistor and a base terminal connected to the base terminal of the amplifying transistor via the capacitance element; and
a fifth resistor having a first terminal connected to the first power supply terminal and having a second terminal connected to the base terminal of the fifth transistor, wherein the fifth transistor is operated by a current supplied from the first power supply terminal to the base terminal of the fifth transistor via the fifth resistor when the voltage applied to the reference voltage input terminal is lower than a voltage at which the first transistor operates.

12. The power amplification bias circuit according to claim 9, the bias circuit further including:
a capacitance element;
a sixth transistor having a collector terminal connected to the collector terminal of the amplifying transistor and a base terminal connected to the base terminal of the amplifying transistor via the capacitance element; and
a fifth resistor having a first terminal connected to the first power supply terminal and having a second terminal connected to the base terminal of the sixth transistor, wherein the sixth transistor is operated by a current supplied from the first power supply terminal to the base terminal of the sixth transistor via the fifth resistor when the voltage applied to the reference voltage input terminal is lower than a voltage at which the first transistor operates.

13. The power amplification bias circuit according to claim 10, the bias circuit further including:
a capacitance element;
a seventh transistor having a collector terminal connected to the collector terminal of the amplifying transistor and a base terminal connected to the base terminal of the amplifying transistor via the capacitance element; and
a fifth resistor having a first terminal connected to the first power supply terminal and having a second terminal connected to the base terminal of the seventh transistor, wherein the seventh transistor is operated by a current supplied from the first power supply terminal to the base terminal of the seventh transistor via the fifth resistor when the voltage applied to the reference voltage input terminal is lower than a voltage at which the first transistor operates.

* * * * *